United States Patent
Shen

(10) Patent No.: US 7,248,850 B2
(45) Date of Patent: Jul. 24, 2007

(54) PASSIVE SUBHARMONIC MIXER DESIGN

(75) Inventor: David H. Shen, Saratoga, CA (US)

(73) Assignee: NanoAmp Solutions, Inc., Sunnyvale, CA (US)

(*) Notice: Subject to any disclaimer, the term of this patent is extended or adjusted under 35 U.S.C. 154(b) by 379 days.

(21) Appl. No.: 10/729,638

(22) Filed: Dec. 5, 2003

(65) Prior Publication Data
US 2004/0121751 A1  Jun. 24, 2004

Related U.S. Application Data

(60) Provisional application No. 60/431,979, filed on Dec. 10, 2002.

(51) Int. Cl.
H04B 1/28 (2006.01)

(52) U.S. Cl. .................. 455/318; 455/333

(58) Field of Classification Search ........... 455/313, 455/315, 318–319, 323, 324, 326, 333; 327/113
See application file for complete search history.

(56) References Cited

U.S. PATENT DOCUMENTS

| | | | | |
|---|---|---|---|---|
| 5,532,637 A | * | 7/1996 | Khoury et al. | 327/359 |
| 5,999,804 A | * | 12/1999 | Forgues | 455/333 |
| 6,370,372 B1 | | 4/2002 | Molnar | |
| 6,639,447 B2 | * | 10/2003 | Manku et al. | 327/359 |
| 6,999,747 B2 | * | 2/2006 | Su | 455/324 |

OTHER PUBLICATIONS

Liwei Sheng, Jonathan C. Jensen and Lawrence E. Larson A Wide-Bandwidth Si/SiGe HBT Direct Conversion Sub-Harmonic Mixer/Downconverter, IEEE Journal of Solid-State Circuits, vol. 36, No. 9, Sep. 2000, pp. 1329-1337.

Jan Crols and Michel S. J. Steyaert A 1.5 GHz Highly Linear CMOS Downconversion Mixer, IEEE Journal of Solid-State Circuits, vol. 30, No. 7, Jul. 1995, pp. 736-742.

* cited by examiner

*Primary Examiner*—Nguyen T. Vo
(74) *Attorney, Agent, or Firm*—Fish & Richardson P.C.

(57) ABSTRACT

A mixer design is described that permits greater integration on standard silicon chips with an improvement in power and linearity compared to previous mixer designs, enabling low-power, high performance RF reception.

9 Claims, 5 Drawing Sheets

PASSIVE SUBHARMONIC MIXER DESIGN

This application is based on the provisional application No. 60/431,979 filed on Dec. 10, 2002 and application Ser. No. 10/729,638 filed on Dec. 5, 2003

REFERENCES

[1] Sheng, et al., "A Wide-Bandwidth Si/SiGE Direct Conversion HBT Sub-Harmonic Mixer/Downconverter," *IEEE Journal of Solid-State Circuits*, vol. 36, no. 9, September, 2000, pp. 1329-1337.
[2] U.S. Pat. No. 6,370,372, Apr. 9, 2002, Molnar et al.
[3] Crols, et al., "A 1.5 GHz Highly Linear CMOS Downconversion Mixer," *IEEE Journal of Solid-State Circuits*, vol. 30, no. 7, July 1995, pp. 736-742.

BACKGROUND

1. Technical Field of Invention

The present invention relates to radio receivers and methods for the reception of RF (radio frequency) communication signals in a highly integrated receiver.

2. Background of The Invention and Discussion of Prior Art

At the present time, the vast majority of RF communication receivers are of the superheterodyne type. This type of receiver uses one or more IF (intermediate frequency) stages for filtering and amplifying signals at a fixed frequency within an IF chain. This radio architecture has the advantage that fixed filters may be used in the LO chain. In order for the receiver to be useable over multiple bands, its typical architecture is as the single-band receiver shown in FIG. 1. An RF signal arriving at an antenna 11 passes through a band-select RF filter 13, an LNA (low noise amplifier), 15, and into an image filter, 17, which produce a band-limited RF signal. This band-limited RF signal then enters the first mixer 19, which translates the RF signal down to an intermediate frequency by mixing it with the signal produced by the first LO (local oscillator) 21. The undesired mixer products in the IF signal are rejected by an IF filter, 23. The filtered IF signal then enters an IF amplifier stage, 25, after which the outputs feeds into the second mixer 27 which translates it down to yet another intermediate frequency by mixing it with the signal produced by a second LO, 28. The signal is then sent to the baseband for processing. Tuning into a particular channel within the band-limited RF signal is accomplished by varying the frequency of each LO, 21 and 28.

In order to reduce size, power consumption, and cost, it would be advantageous to integrate the electronic components of radio receiver and transmitter to reduce the number of filters and mixers. The superheterodyne design, however, requires high quality, narrowband IF bandpass filters that are typically implemented off-chip. These filtering components impose a lower limit to the size, materials cost, assembly cost, and power consumption of receiver and transmitter built using the superheterodyne design. Moreover, the necessity for mixer and local oscillator circuits operating at high frequencies contributes greatly to the power consumption and general complexity of the superheterodyne receiver. In particular, the high-frequency analog mixers require a large amount of power to maintain linear operation. Although many variations of the superheterodyne design exist, they all share the limitations of the particular design just described.

The growing demand for portable communications has motivated attempts to design radio receivers that permit the integration of more components onto a single chip. Recent advances in semiconductor processing of inductors are allowing more and more of these filters to be implemented on-chip.

A second receiver design is the direct-conversion, or zero-IF, receiver shown in FIG. 2. An antenna 57 couples a RF signal through a first bandpass RF filter, 59, into a LNA, 61. The signal then proceeds through a second RF filter 63, yielding a band-limited RF signal, which then enters a mixer, 65, and mixes with an LO frequency produced by an LO, 67. Up to this point, the direct-conversion receiver design is essentially the same as the previous receiver design. Unlike the previous designs, however, the LO frequency is set to the carrier frequency of the RF channel of interest. The resulting mixer product is a zero-frequency IF signal—a modulated signal at baseband frequency. The mixer output, 67, is coupled into a lowpass analog filter 69 before proceeding into baseband information signal for use by the remainder of the communications system. In either case, tuning is accomplished by varying the frequency of LO, 67, thereby converting different RF channels to zero-frequency IF signals.

Because the direct-conversion receiver design produces a zero-frequency IF signal, its filter requirements are greatly simplified—no external IF filter components are needed since the zero-IF signal is an audio frequency signal that can be filtered by a low-quality lowpass filter. This allows the receiver to be integrated in a standard silicon process from mixer 65 onwards, making the direct-conversion receiver design potentially attractive for portable applications.

The direct-conversion design, however, has several problems, some of which are quite serious. As with the other designs described above, the RF and image filters required in the direct-conversion design must be high-quality narrowband filters that must remain off-chip. Moreover, this design requires the use of high-frequency mixer and LO circuits that require large amounts of power. Additionally, radiated power from LO, 67, can couple into antenna 57, producing a DC offset at the output of mixer, 65. This DC offset can be much greater than the desired zero-IF signal, making signal reception difficult. Radiated power from LO 67 can also affect other nearby direct-conversion receivers tuned to the same radio frequency.

The active subharmonic mixer is known as prior art as a method to reduce the local oscillator self-mixing and radiation problems in a direct conversion (or low IF) receiver by using multiple phases of a subharmonic frequency in multistack double-balanced active mixer topology [1][2]. FIG. 3 is block diagram of a prior art subharmonic mixer. In this mixer, RF inputs, 71 and 72, are converted to currents by transistors 79 and 80. The in-phase local oscillator signals 73 and 74 drive the first stage of current commutators of transistors 81-84, and the quadrature local oscillator signals 75 and 76 drive the second stage of current commutators 85-88. The result currents are converted to output voltages 77 and 78 by resistors 89 and 90. These methods rely on active mixers that do not scale well with lower supply voltages, have significant non-linearity, have high power dissipation, and can not be effectively implemented in MOS technologies.

OBJECTS AND ADVANTAGES OF THE INVENTION

Accordingly, it is a primary object of the present invention to provide a passive subharmonic mixer design that can reduce local oscillator radiation, operate at low supply voltages, work with low power dissipation, and achieve high linearity. The new mixer can be used in a direct conversion or low IF receiver architecture to increased integration and decreased power consumption without the operational problems associated with previous receiver designs. It is a further object of the invention to provide an equivalent performance to the traditional multi-band superheterodyne receiver of FIG. 1.

SUMMARY OF THE INVENTION

The present invention achieves the above objects and advantages by providing a new method for implementing a subharmonic mixer in a passive configuration. This method uses multiple phases of the local oscillator to drive switches that create a harmonic mixing of the RF input signal.

DESCRIPTION OF THE PREFERRED EMBODIMENT

Figure 1:
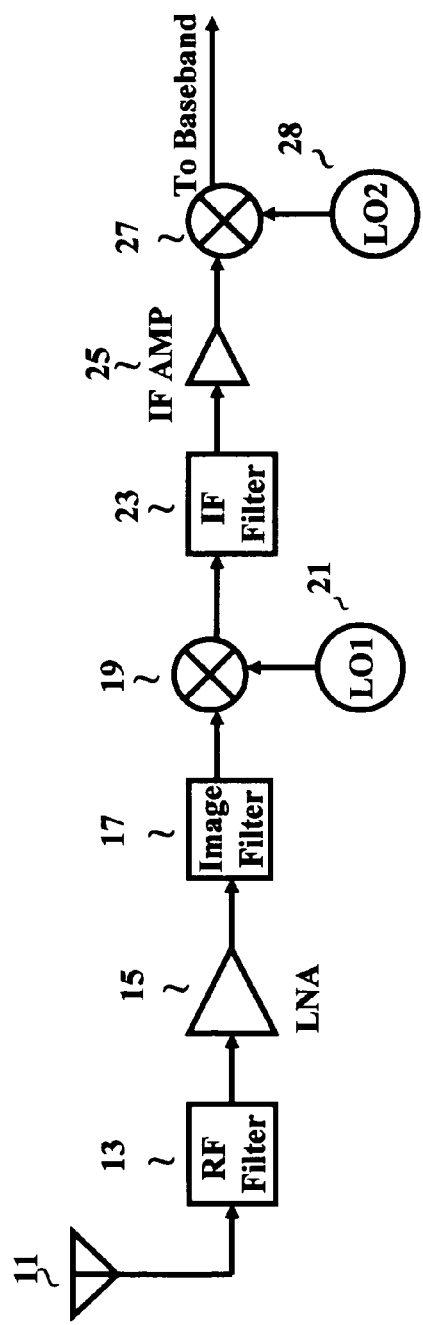
FIG. 1 is a block diagram of a dual-band superheterodyne receiver considered as prior art.
Figure 2:
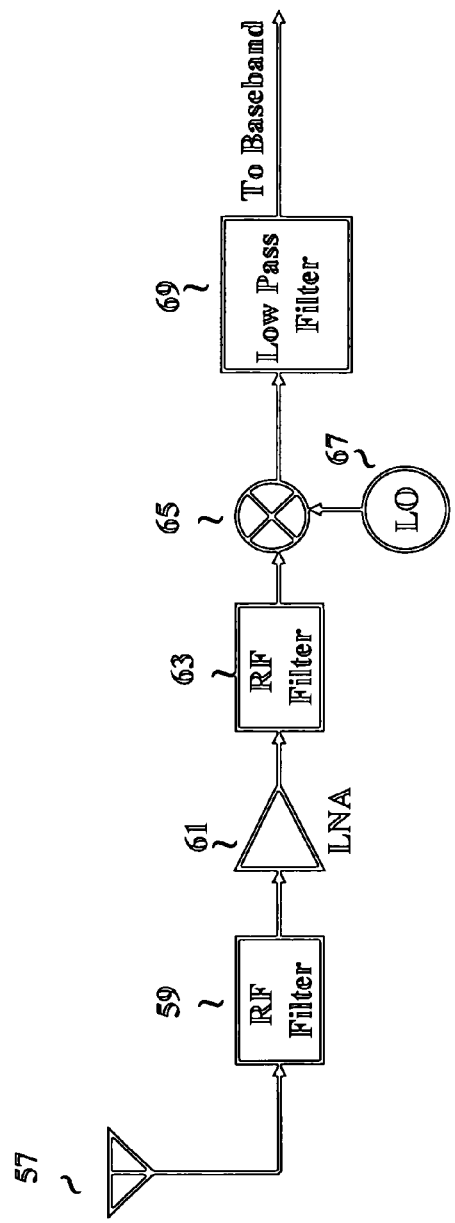
FIG. 2 is a block diagram of a direct-conversion receiver considered as prior art.
Figure 3:
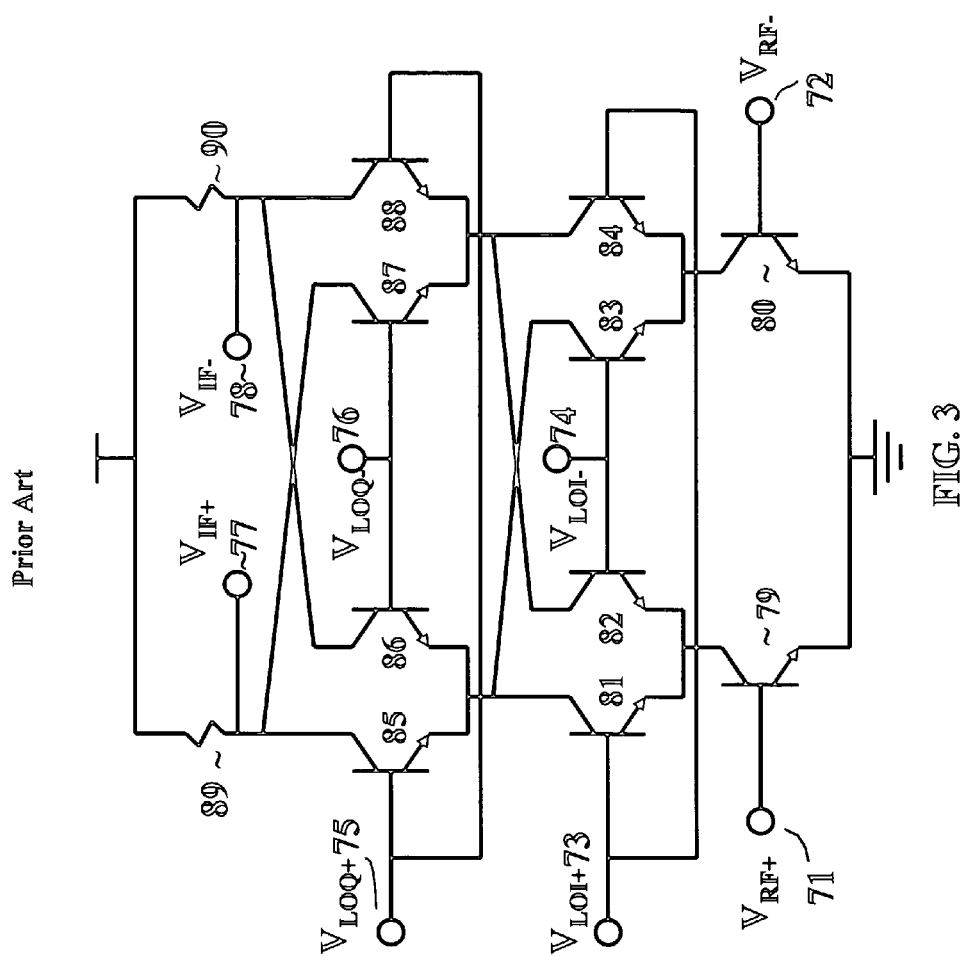
FIG. 3 is a schematic of a prior art active sub-harmonic mixer.
Figure 4:
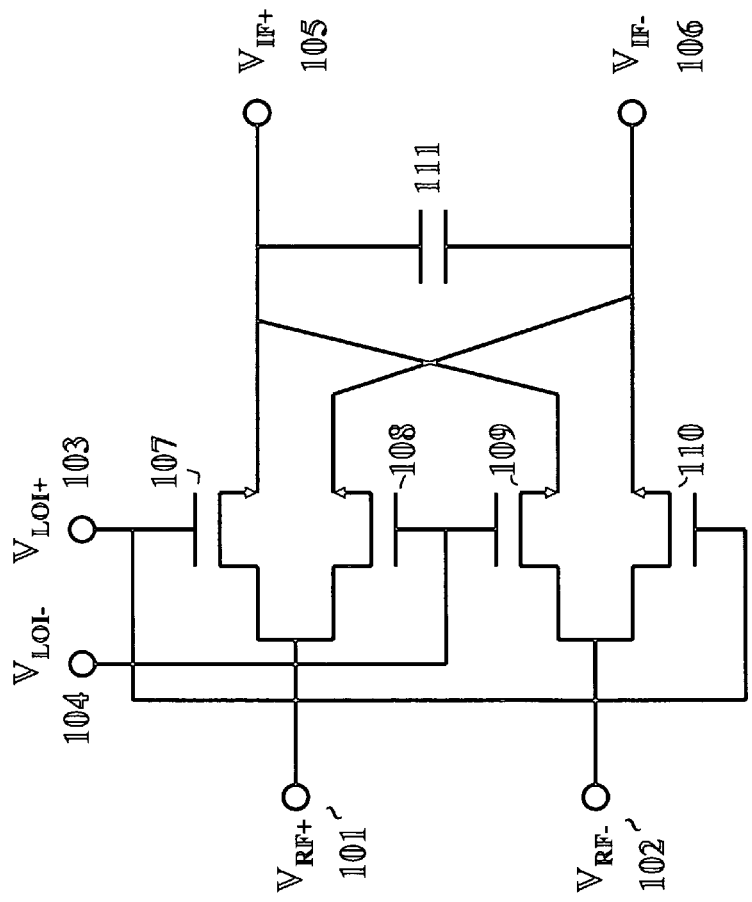
FIG. 4 is a schematic of a prior art passive mixer.

FIG. 4 is a block diagram of a passive mixer known as prior art [3]. It consists of RF inputs, 101 and 102, that are connect to four MOS switches, 107-110, with gates driven by the local oscillator positive and negative differential phases, 103 and 104. The load capacitor 111 is used to filter the high frequency noise of the system. The local oscillator signal, 103 and 104, inverts the phase of the RF input, 101 and 102, on every half cycle, thus producing the mixing function between the RF input and the local oscillator input. Because the switches are passive components and do not dissipate power, the passive mixer has advantages compared to an active mixer with reduce power and improved linearity.

Figure 5:
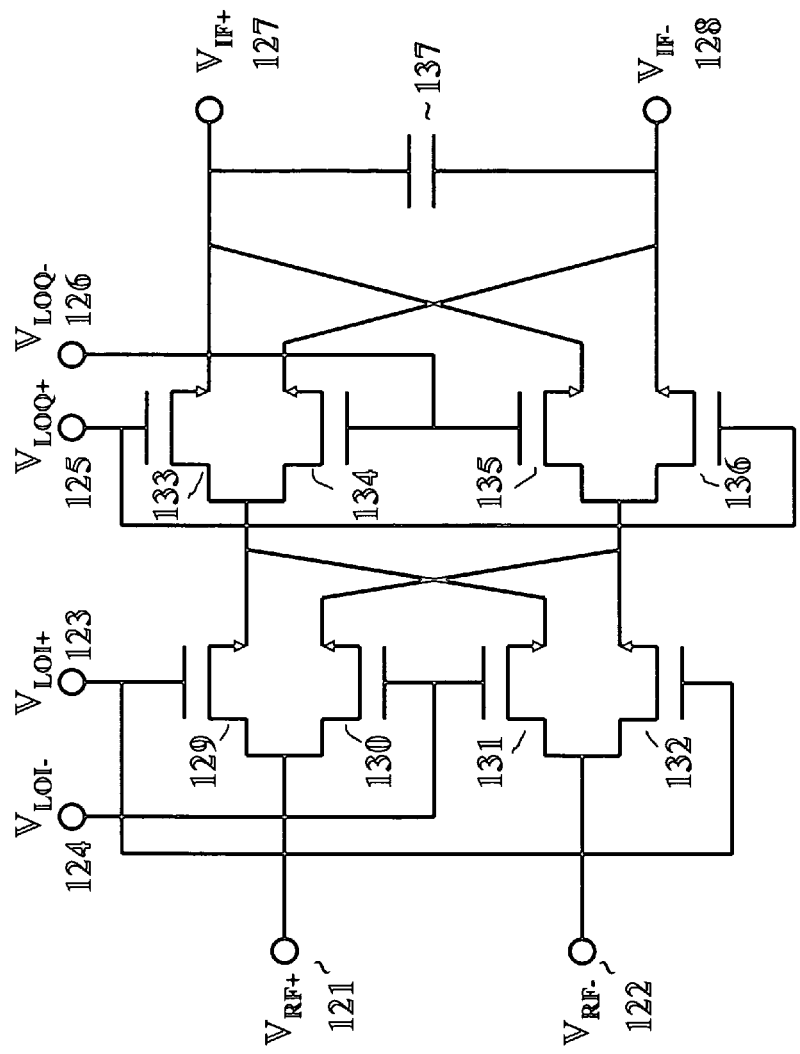
FIG. 5 is a schematic of one embodiment of the invention.

FIG. 5 is a schematic of a passive subharmonic mixer constructed in accordance with the principles of the present invention. This embodiment is for a local oscillator running at one half the mixing frequency, and thus requires differential in-phase 123 and 124 and quadrature-phase 125 and 126 local oscillator signal inputs. The RF input is connected to the source terminals 121 and 122 of the first set of MOS switches 129-132. The gates of the MOS switches are connected to the positive and differential phases of the in-phase local oscillator signals 123 and 124. The drains terminals of the MOS switches 129-132 are connected to a second set of MOS switches 133-136, whose gates are connected to the quadrature-phase local oscillator signals 125 and 126. The combined mixing action of the two levels of MOS switches creates an effective mixing by $2*f_{LO}$, where $f_{LO}$ is the frequency of the local oscillator. By swapping the in-phase 123 and 124 and quadrature-phase 125 and 126 local oscillator signals, the mixer performs a 90 degrees phase shifted mixing function. Capacitor 137 is the load and a filter for high frequency signals. It also is possible to use three levels of MOS switches to produce a mixing by $3*f_{LO}$ by using a three differential phases of the local oscillator signal. These and other modifications, which are obvious to those skilled in the art, are intended to be included within the scope of the present invention. Accordingly, the scope of the invention should be determined not by the embodiment described, but by the appended claims and their legal equivalents.

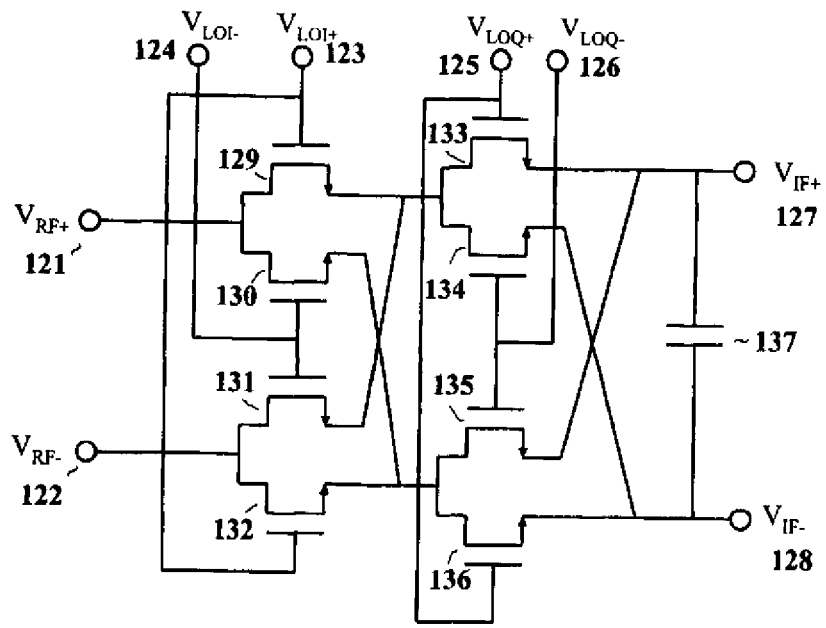

The invention claimed is:

1. A mixer comprising:
   a first set of differential switches wherein source terminals of the first set of differential switches are configured to couple to a differential RF input signal,
      wherein drain terminals of the first set of differential switches are connected to source terminals of a second set of differential switches,
      wherein drain terminals of the second set of differential switches comprise mixer outputs,
      wherein gate terminals of the first set of differential switches and the second set of differential switches are connected to differential local oscillator sources that are phase shifted from each other, and
      wherein each of the first and the second sets of differential switches comprises of a pair of complementary gate-controlled transistors.

2. The mixer of claim 1 wherein there are three or more sets of switches connected in series.

3. The mixer of claim 1 wherein the switches are based on FET transistors.

4. The mixer of claim 1 wherein the switches are based on GaAs transistors.

5. The mixer of claim 1 wherein the switches are based on MOS transistors.

6. The mixer of claim 1 wherein the switches are single gate-controlled transistors.

7. The mixer of claim 1 wherein the gate terminals for the first set of differential switches are connected to a differential in-phase local oscillator signal and the gate terminals for the second set of differential switches are connected to a differential quadrature-phase local oscillator signal.

8. The mixer of claim 1 wherein the gate terminals for the first set of differential switches are connected to a differential quadrature-phase local oscillator signals and the second set of differential switches are connected to a differential in-phase local oscillator signal.

9. The mixers of claims 1-8, wherein the mixer comprises a reversible mixer configuration, wherein the input and output terminal connections are reversible.

* * * * *

UNITED STATES PATENT AND TRADEMARK OFFICE
CERTIFICATE OF CORRECTION

PATENT NO. : 7,248,850 B2
APPLICATION NO. : 10/729638
DATED : July 24, 2007
INVENTOR(S) : David H. Shen It is certified that error appears in the above-identified patent and that said Letters Patent is hereby corrected as shown below:

The title page, showing an illustrative figure should be deleted and substitute therefor the attached title page.

Signed and Sealed this

Twenty-seventh Day of July, 2010

David J. Kappos
*Director of the United States Patent and Trademark Office*

CERTIFICATE OF CORRECTION (continued)

(12) United States Patent
Shen

(10) Patent No.: US 7,248,850 B2
(45) Date of Patent: Jul. 24, 2007

(54) PASSIVE SUBHARMONIC MIXER DESIGN

(75) Inventor: David H. Shen, Saratoga, CA (US)

(73) Assignee: NanoAmp Solutions, Inc., Sunnyvale, CA (US)

(*) Notice: Subject to any disclaimer, the term of this patent is extended or adjusted under 35 U.S.C. 154(b) by 379 days.

(21) Appl. No.: 10/729,638

(22) Filed: Dec. 5, 2003

(65) Prior Publication Data
US 2004/0121751 A1  Jun. 24, 2004

Related U.S. Application Data

(60) Provisional application No. 60/431,979, filed on Dec. 10, 2002.

(51) Int. Cl.
H04B 1/28 (2006.01)
(52) U.S. Cl. .................................... 455/318; 455/333
(58) Field of Classification Search ............. 455/313, 455/315, 318–319, 323, 324, 326, 333; 327/113
See application file for complete search history.

(56) References Cited

U.S. PATENT DOCUMENTS 5,532,637 A * 7/1996 Khoury et al. ............ 327/359
5,999,804 A * 12/1999 Forgues ..................... 455/333
6,370,372 B1   4/2002 Molnar
6,639,447 B2 * 10/2003 Manku et al. .............. 327/359
6,999,747 B2 * 2/2006 Su ............................. 455/324

OTHER PUBLICATIONS

Liwei Sheng, Jonathan C. Jensen and Lawrence E. Larson A Wide-Bandwidth Si/SiGe HBT Direct Conversion Sub-Harmonic Mixer/Downconverter, IEEE Journal of Solid-State Circuits, vol. 36, No. 9, Sep. 2000, pp. 1329-1337.
Jan Crols and Michel S. J. Steyaert A 1.5 GHz Highly Linear CMOS Downconversion Mixer, IEEE Journal of Solid-State Circuits, vol. 30, No. 7, Jul. 1995, pp. 736-742.

* cited by examiner

Primary Examiner—Nguyen T. Vo
(74) Attorney, Agent, or Firm—Fish & Richardson P.C.

(57) ABSTRACT

A mixer design is described that permits greater integration on standard silicon chips with an improvement in power and linearity compared to previous mixer designs, enabling low-power, high performance RF reception.

9 Claims, 5 Drawing Sheets